United States Patent [19]
Okazaki et al.

[11] Patent Number: 5,298,768
[45] Date of Patent: Mar. 29, 1994

[54] LEADLESS CHIP-TYPE LIGHT EMITTING ELEMENT

[75] Inventors: Jun Okazaki, Tondabayashi; Masaaki Katoh, Osaka, both of Japan

[73] Assignee: Sharp Kabushiki Kaisha, Osaka, Japan

[21] Appl. No.: 998,746

[22] Filed: Dec. 30, 1992

[30] Foreign Application Priority Data

Feb. 14, 1992 [JP] Japan .................................. 4-28477
Jun. 15, 1992 [JP] Japan ................................. 4-154846

[51] Int. Cl.$^5$ ................................... H01L 33/00
[52] U.S. Cl. ........................ 257/81; 257/82; 257/88; 257/91; 257/99; 257/100
[58] Field of Search ............... 257/99, 100, 91, 88, 257/98, 81, 82

[56] References Cited

U.S. PATENT DOCUMENTS

| | | | |
|---|---|---|---|
| 4,013,915 | 3/1977 | Dufft | 257/99 XR |
| 5,035,483 | 7/1991 | Waitl et al. | 350/96.20 |
| 5,089,861 | 2/1992 | Tanaka et al. | 257/99 XR |

FOREIGN PATENT DOCUMENTS

| | | | |
|---|---|---|---|
| 59-119777 | 7/1984 | Japan | 257/99 |
| 60-137076 | 7/1985 | Japan | 257/99 |
| 60-43040 | 9/1985 | Japan | . |
| 62-85481 | 4/1987 | Japan | 257/99 |
| 2-229477 | 9/1990 | Japan | 257/100 |

*Primary Examiner*—William Mintel

[57] ABSTRACT

A light emitting element having a cavity at the center of the top surface of an insulating block body. A through-hole extends downward through the block body to the bottom of the cavity. A metallic layer is present on the sides and bottom of the cavity, the sides of the through-hole, the bottom surface and part of the side surfaces of the block body. An LED chip is disposed on the metallic layer to the side of the bottom of the cavity. The LED chip and the metallic layer formed on a side of the bottom of the cavity separate from the first side are connected by a metallic wire. The cavity and the through-hole are filled with resin for encapsulating the LED chip.

23 Claims, 10 Drawing Sheets

LEADLESS CHIP-TYPE LIGHT EMITTING ELEMENT

FIELD OF THE INVENTION

The present invention relates to a light emitting element, for example, chip LEDs (light emitting diodes) used as back light for liquid crystal displays, a light array in facsimile machines, and as a display member in various kinds of operation panels.

BACKGROUND OF THE INVENTION

Various types of chip LEDs have been developed. For example, the following four types of chip LEDs are generally known. A chip LED of type I is formed by molding a fiberglass-reinforced epoxy resin substrate having a metallic layer. A chip LED of type II is formed with the use of a lead frame by transfer-molding the epoxy resin. A chip LED of type III is formed by insert-molding a case in a lead frame in advance and by filling the case with the epoxy resin after mounting an LED chip. A chip LED of type IV is formed by forming a case in a fiberglass-reinforced epoxy resin substrate and filling the case with the epoxy resin like type III. In addition to these types of chip LEDs, as disclosed in the Japanese Publication for Unexamined Patent Applications, No. 107283/1980 and No. 283883/1989, there are LED lamps which are produced by forming a wiring pattern in a three dimensional manner on an injection-molded resin, without using a lead frame.

As for the chip LED of type I, since the difference in the linear expansion coefficient between the fiberglass-reinforced epoxy resin substrate (7 to $1 \times 10^{-6}/°C$.) and the epoxy resin (4 to $6 \times 10^{-5}/°C$.) is great, they are likely separated when heat is applied, for example, in soldering. In addition, the fiberglass-reinforced epoxy resin substrate is flat and the chip LED of this type does not have a reflecting case structure, resulting in an LED lamp with poor luminous intensity.

As for the chip LEDs of type III and type IV, since these chip LEDs have reflecting cases, the light emitted by their LED chips is effectively directed in the upper direction. However, they have a drawback in terms of adhesion of the lead frame and the case or adhesion of the fiberglass-reinforced epoxy resin substrate and the case, and are not resistant to high temperatures in soldering like type I. Furthermore, with respect to types III and IV, insert-molding the case in the lead frame and bonding of the case to the substrate respectively increase the manufacturing costs.

As for the chip LED of type II, since it does not have a reflecting case, the light emitted by the LED chip is scattered in the forward direction and therefore the light is not efficiently directed in the upper direction.

On the other hand, the chip LEDs disclosed in the Japanese Publication for Unexamined Patent Applications, No. 107283/1980 and No. 283883/1989, have an insulating block body. Each block body has a reflecting case (a cavity) in the form of a recess at the center in its top surface. The sides of the cavity slope. The cavity, top surface, side surfaces and part of the bottom surface of the block body are covered with a pair of electrode patterns (plated layer). In such chip LEDs, the reflecting case and the electrode patterns are united. This arrangement therefore overcomes the problem, i.e., insufficient adhesion of the lead frame and reflecting case, associated with the above-mentioned chip LEDs using lead frames, and reduces the manufacturing costs However, in the chip LEDs having the electrode patterns formed on the insulating block body by plating, when sealing the cavities in a substrate whereon a number of chip LEDs are produced, an epoxy resin is dropped into each cavity. Therefore, even if a small amount of the epoxy resin overflows from a cavity, the resin flows to the bottom of the block body through its through-hole which is necessary for chemical plating and for forming electrodes on the top and bottom surfaces of the substrate. When the epoxy resin flows to the bottom of the block body, soldering cannot be performed properly in mounting the chip LED as a product. This problem is solved by increasing the capacity of the cavity. However, the cavity with an increased capacity causes an increase in the size of the chip LED. The resulting chip LED does not meet demand for smaller and thinner chip LEDs. Therefore, the chip LED is always formed with a cavity of the minimum possible capacity. Consequently, the resin must be poured into each cavity on the substrate with precision.

To increase the light emission efficiency of the LED lamp, the sides of the cavity must slope at a small angle between 30° and 70°. However, if the cavity becomes shallower, the epoxy resin more likely overflows. The reason for this is that the viscosity of the epoxy resin momentary decreases during heat curing and it spreads around the cavity when it comes to a level higher than the brim of the cavity.

Moreover, if the cavity is shallow, the adhesion of the epoxy resin and reflecting case becomes weaker and the epoxy resin and the reflecting case are easily separated from each other when heat is applied, for example, in soldering. Namely, when the cavity is formed in the above-mentioned shape, the light emission efficiency and the quality of the product improve. However, this causes complicated manufacturing processes and an increase in the manufacturing costs.

In the meantime, the chip LED is mounted on and electrically joined to one of the electrode patterns, and is connected to the other electrode pattern with a metallic wire.

In a chip LED of this type, since the respective electrodes are formed over the entire side surfaces of the block body and on the surface of the cavity in which the translucent resin is poured, solder may climb the side surfaces of the electrodes to the top surface of the LED in surface-mounting. As a result, the appearance of the product after mounted, and the quality of the translucent resin deteriorate. Moreover, when the electrodes are formed in the above-mentioned manner, they consume a large amount of solder, causing so-called Manhattan Phenomena (in which the chip part falls over).

SUMMARY OF THE INVENTION

An object of the present invention is to improve light emission efficiency and product quality of a light emitting element while reducing the number of components and the manufacturing costs.

To achieve the above-mentioned object, the light emitting element of the present invention has at least the following means:

(a) an insulating substrate having at the center of the top surface thereof a cavity with sides sloping outward toward the top and a through-hole formed in the bottom of the cavity, the through-hole extending downward through the insulating substrate;

(b) a first electrode which is formed to continuously cover a first side of the cavity, the through-hole, the bottom surface and part of the first side surface of the substrate;

(c) a second electrode which is formed to continuously cover a second side of the cavity, the through-hole, the bottom surface and part of the second side surface of the substrate, the second side of the cavity facing the first side of the cavity, the second side surface of the substrate facing the first side surface of the substrate;

(d) light emitting means, electrically joined to the first electrode, for emitting light when electricity is conducted;

(e) connecting means for electrically connecting the light emitting means to the second electrode; and (f) translucent sealing means for filling the cavity and the through-hole.

In the light emitting element, the through-hole which is necessary for forming the electrodes is incorporated in the substrate by forming in the bottom of the cavity a hole extending downward through the substrate and by continuously forming the first and second electrodes on the cavity, the through-hole, and on the bottom surface and part of the side surfaces of the substrate. This arrangement enables a reduction in the number of components. Moreover, since the above-mentioned through-hole functions as an air vent when filling the cavity and the through-hole with the sealing means, the cavity and the through-hole are firmly sealed up.

When surface-mounting the light emitting element by soldering, solder does not climb the electrodes because the first and second electrodes are formed over only part of the side surfaces of the substrate. It is thus possible to prevent the appearance of the product from deteriorating and the Manhattan phenomena which occur when a large amount of solder is consumed.

For a fuller understanding of the nature and advantages of the invention, reference should be made to the ensuing detailed description taken in conjunction with the accompanying drawings.

DETAILED DESCRIPTION OF THE PREFERRED EMBODIMENTS

Embodiment 1

Figure 1:
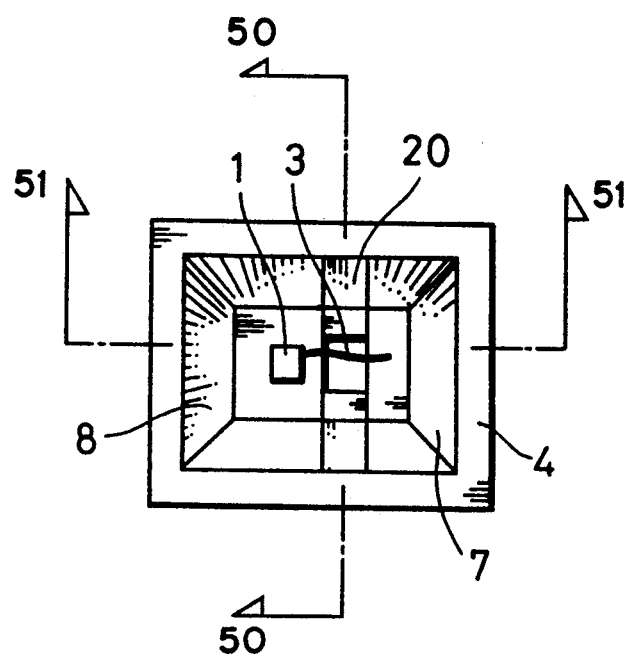
FIG. 1 is a plan view of a chip LED according to one embodiment of the present invention.
Figure 2:
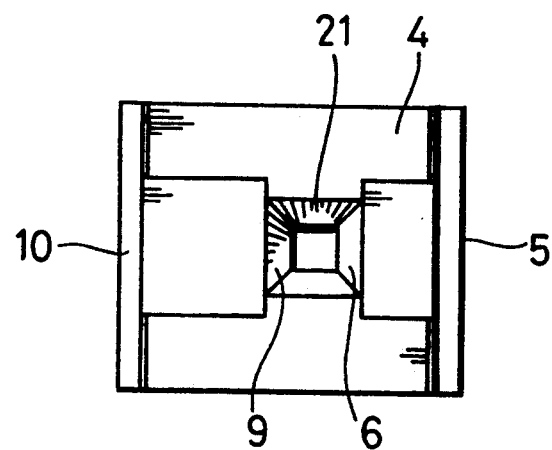
FIG. 2 is a bottom view of the chip LED.
Figure 3:
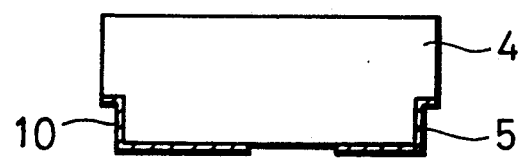
FIG. 3 is a front view of the chip LED.
Figure 4:
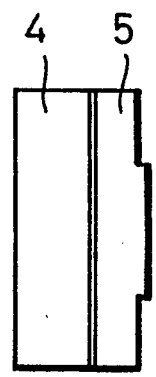
FIG. 4 is a side view of the chip LED.
Figure 5:
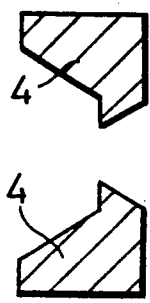
FIG. 5 is a profile of the chip LED cut across the line E—E.

The following description discusses a first embodiment of the present invention with reference to FIGS. 1 through 11. In this embodiment, a chip LED is adopted as a light emitting element.

As shown in FIGS. 1 through 6, the main components of the chip LED relating to this embodiment are an insulating block body 4, a pair of metallic layers, 18 and 19, an LED chip 1, a metallic wire 3, and a translucent resin 11.

The insulating block body 4 has a cavity 20 and a through-hole 21, formed in the bottom of the cavity 20, extending downward through the insulating block body 4. The sides of the cavity 20 slope outward toward the top.

The metallic layer 18 is formed by continuously plating the side and bottom 7 of the cavity 20, the side 6 of the through-hole 21, and the bottom surface and part of the side surface 5 of the block body 4. Meanwhile, the metallic layer 19 is formed by plating the side and bottom of the cavity 20, the side 9 of the through-hole 21, and the bottom surface and part of side surface 10 of the block body 4. The metallic layer 19, located on the left in FIG. 6, and the metallic layer 18 are substantially symmetrical and electrically separated from each other.

The LED chip 1 is fixed on (electrically joined to) the bottom 8 of the cavity 20 with a conductive paste 2, and is electrically connected to the bottom 7 of the cavity 20 with the metallic wire 3.

Next, the structure of the chip LED and process for manufacturing the chip LED are briefly described below.

Firstly, the insulating block body 4 is formed by a heat-resistant resin. For example, a liquid crystal polymer, PPS, PES, or other material generally used for manufacturing LEDs is employed. Secondly, the cavity 20 on which the LED chip 1 is to be mounted is formed in the insulating block body 4. Thirdly, the through-hole 21 is made on the bottom of the cavity 20 to go through the bottom surface of the insulating block body 4.

Next, a pair of metallic layers, 18 and 19, are formed on the block body 4. On the side of the block body 4 where the LED chip 1 is to be mounted, for example, the metallic layer 19 is formed to continuously cover the side (reflecting surface) and bottom (chip-mount portion) 8 of the cavity 20, the side 9 of the through-hole 21, and the bottom surface and part of the side surface 10 of the block body 4. In the same manner, the metallic layer 18 is formed to cover the side and bottom 7 of the cavity 20, the side 6 of the through-hole 21, and the bottom surface and part of the side surface 5 of the block body 4.

After the pair of the metallic layers, 18 and 19, are formed, the LED chip 1 is bonded onto the metallic layer 19 on the bottom of the cavity 20 with the conductive paste 2, and is connected to the metallic layer 18 with the metallic wire 3.

Figure 6:
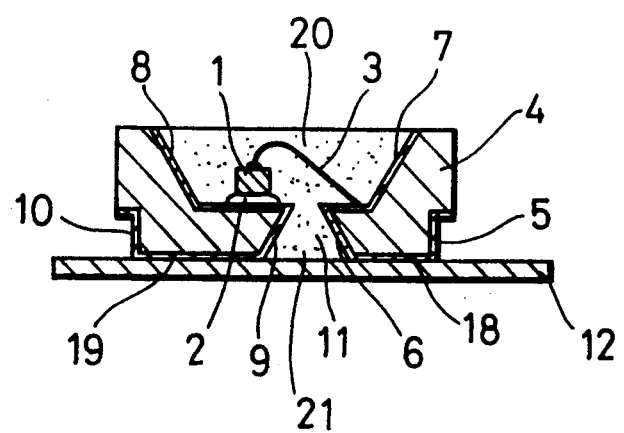
FIG. 6 is a profile of the chip LED cut across the line F—F.

Then, the cavity 20 and the through-hole 21 are filled with a translucent resin such as an epoxy resin to form a translucent resin section 11. To prevent leakage of the translucent resin from the through-hole 21, the block body 4 is fixed on a heat-resistant sticky tape such as a glass cloth tape 12 as shown in FIG. 6. The glass cloth tape 12 is peeled off after hardening the resin to complete the product.

The translucent resin section 11 occupies the cavity 20 and the through-hole 21, in particular, from a portion of the cavity 20 forming a reflecting case in the proximity of the LED chip 1 to the bottom surface of the product. In contrast to the sides of the cavity 20, the sides of the through-hole 21 slope outward toward the bottom.

The translucent resin section 11 thus formed brings about the following effects. For example, in the case when the insulating block body 4 is formed by a liquid crystal polymer and when an epoxy resin is used to form the translucent resin section 11, the expansion coefficient of the epoxy resin is greater than that of the liquid crystal polymer. Namely, the expansion coefficient of the liquid crystal polymer is 2 to $4 \times 10^{-5}/°C$. and that of the epoxy resin is 5 to $7 \times 10^{-5}/°C$.

Figure 7:
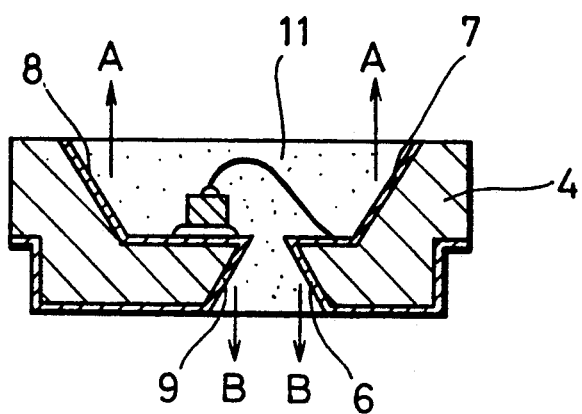
FIG. 7 is a view explaining the thermal stress of an epoxy resin constituting the chip LED.

Consequently, forces acting on the directions A and B are produced as shown in FIG. 7. More specifically, since the force in the A direction is weakened by the force in the B direction in the through-hole 21 (the epoxy resin section formed in the shape of a wedge with respect to the cavity), the epoxy resin and the liquid crystal polymer adhere to one another. If there is no force exerted in the B direction, the product expands and shrinks repeatedly. This may cause the epoxy resin section and the liquid crystal polymer section to be partly or completely separated from each other at the boundaries, 7 and 8, and the metallic wire 3 to be disconnected.

As described above, in the chip LED of this embodiment, the epoxy resin for sealing fills the space from the top of the cavity 20 through the through-hole 21 to the bottom of the liquid crystal polymer section. Additionally, since the epoxy resin section is formed in the shape of wedges engaging with each other in the space in the liquid crystal polymer section, the chip LED is very stable under thermal stress.

Furthermore, it is generally known that, when the chip LED is used as an LED lamp, light emission efficiency is increased by making the sides of the cavity 20 slope at a small angle between 30° and 70° rather than 90°. If the sides slope within this range, the luminous intensity in the forward (upper) direction is increased. However, the adhesion of the epoxy resin and liquid crystal polymer deteriorates as the sloping angle becomes smaller, causing the epoxy resin section to easily come off from the liquid crystal polymer section. To overcome such a problem, in the chip LED of this embodiment, the through-hole 21 extending downward to the bottom surface of block body 4 is formed in the shape of a wedge. This arrangement enables increased light emission efficiency of the LED lamp while preventing the adhesion of the epoxy resin section and liquid crystal polymer section from deteriorating.

Figure 8:
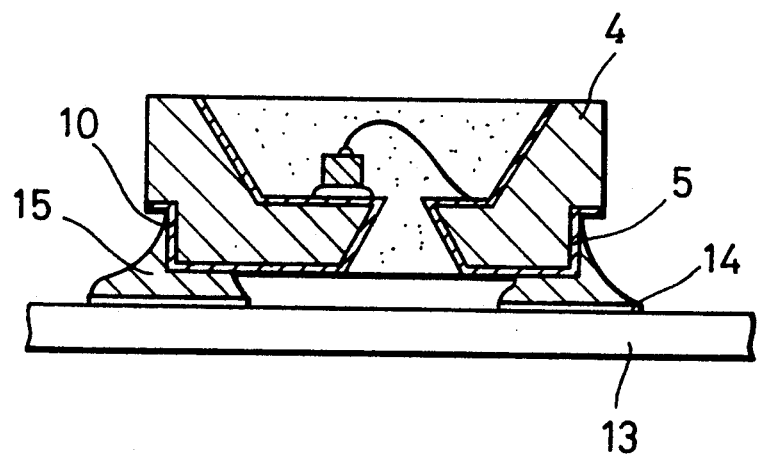
FIG. 8 is a profile of the chip LED soldered.

FIG. 8 schematically shows a soldering state of the chip LED of this embodiment. Numeral 13 represents a substrate on which the block body 4 is surface-mounted, numeric 14 is the wiring, and numeric 15 represents soldered sections. When the metallic layers are formed only on the bottom surfaces of the block body 4 for soldering, if the substrate 13 is warped, the soldered portion 15 may be detached. To prevent such a problem, in this embodiment, the metallic layers are formed not only on the bottom surfaces but also on part of the side surfaces 5 and 10 of the block body 4. The reason for not covering the entire side surfaces of the block body 4 with the metallic layers is related to the process, to be discussed later, performed for preventing leakage of the epoxy resin when filling the cavity 20 and the through-hole 21 with the epoxy resin.

Figure 9:
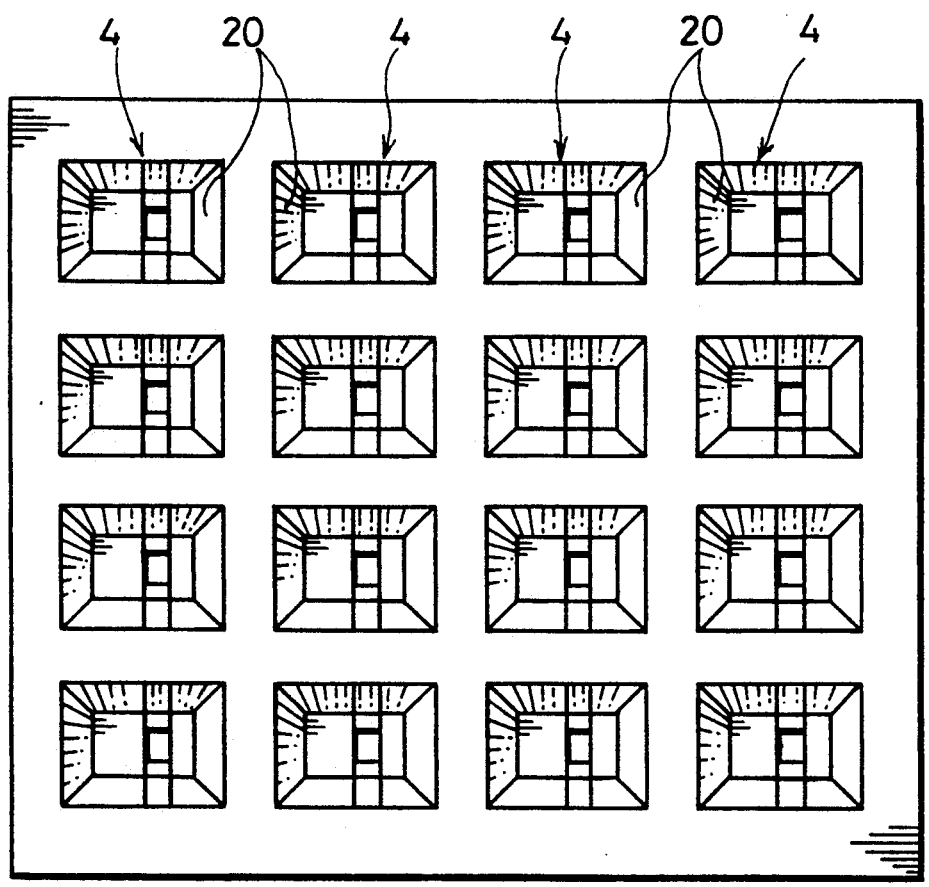
FIG. 9 is a plan view showing an allocation of the chip LEDs in a substrate.

Next, the following description discusses the advantages of the processes of manufacturing chip LEDs. FIG. 9 shows the substrate for the chip LEDs of this embodiment. When using an MID (molded interconnection device) technique in which an electric circuit is formed on a molded product by chemical plating, several products may be manufactured on a substrate since the insulating sections (block bodies 4) are formed by injection molding. This technique enables the products to be processed at a time in each of the subsequent processes and a reduction in the manufacturing costs. Each cavity 20 on the substrate forms a product. Firstly, the LED chip 1 is fixed to each of the cavities 20 on the substrate, shown in FIG. 9, with the conductive paste 2, and is wired with the metallic wire 3.

Then, to prevent leakage of the resin from the through-hole 21 when sealing the cavity 20 and the through-hole 21 with the resin, a heat-resistant sticky tape such as the glass cloth tape 12 is attached to the bottom surface of the substrate. The following method is commonly used in sealing. In this method, the cavities 20 and the through-holes 21 are filled with the resin by dropping the resin into each cavity 20 one by one using a dispenser (a resin discharger). In this method, however, even if a plurality of dispensers are used for a substrate, the resin must be dropped into each cavity 20 one by one. Thus, a long time is required when a number of products are made on the substrate. In addition, the substrate, disclosed in the above-mentioned Japanese Publication for Unexamined Patent Application 283883/1989, has the through-hole which goes through the substrate from the top surface to the bottom surface. Therefore, if the level of precision with respect to pouring a resin into cavities is low, the resin leaks from the bottom, resulting in defective products. Furthermore, the substrate must be carefully handled until the resin introduced into the cavities is hardened otherwise the resin leaks if the substrate tilts.

Figure 10:
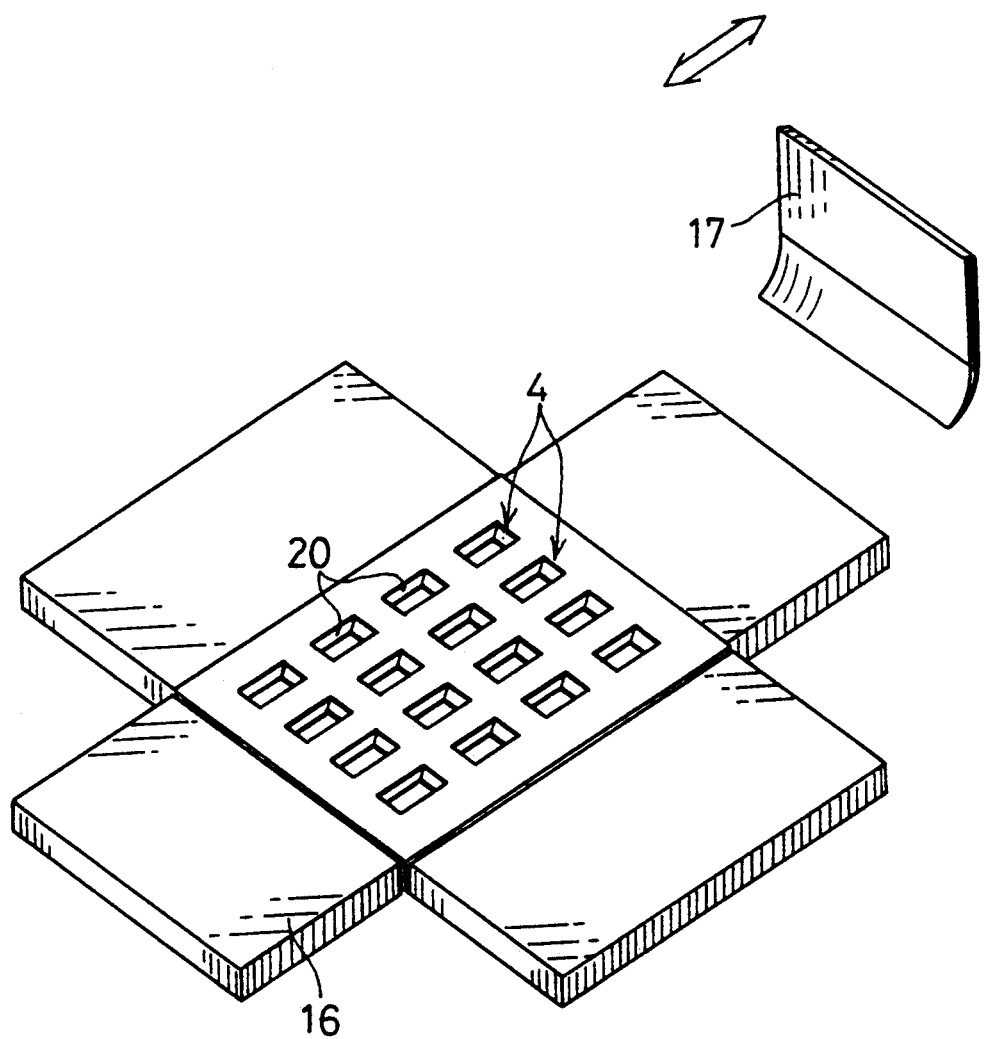
FIG. 10 is a perspective view showing how the resin is sealed in the substrate.

FIG. 10 shows how the resin is sealed in the cavities 20 according to the chip LEDs of this embodiment. The bottom surface of the substrate (on which, for example, an array of 16 LEDs in 4-dot×4-dot patterns are produced as shown in the drawing) is secured with the glass cloth tape 12. Then, the four sides of the substrate is positioned and fixed by fixing members such as silicon rubber substrates 16. Next, the epoxy resin is dropped into the cavities 20. At this time, the epoxy resin can be continuously dropped into the respective cavities 20 without the need for careful precision, i.e., the cavities 20 can brim over.

After filling the cavities 20, a spatula 17 is moved in the directions of the arrows shown in the drawing over the surface of the substrate. Since the overflown resin runs into the cavities 20 which are not completely filled with the resin when the spatula 17 is moved, the surface is levelled. Namely, an excess of the resin is supplied and the excess is scraped out by the spatula 17. In consequence, by comparison with a conventional method in which the resin must be poured into each cavity with precision, with the use of the substrate of this embodiment casting is performed with precision in a shorter time.

In order to reduce the manufacturing costs, it is desirable to increase the number of products produced on a substrate. As the number of products produced on a substrate increases, the above-mentioned method produces more favorable effects.

For instance, if a resin discharging nozzle is installed in front of the spatula 17, it is possible to pour the resin into the cavities 20 and to level off the resin with a single motion. This arrangement enables casting to be performed with less precision needed in a shorter time in comparison to a conventional arrangement using a dispenser.

Figure 11:
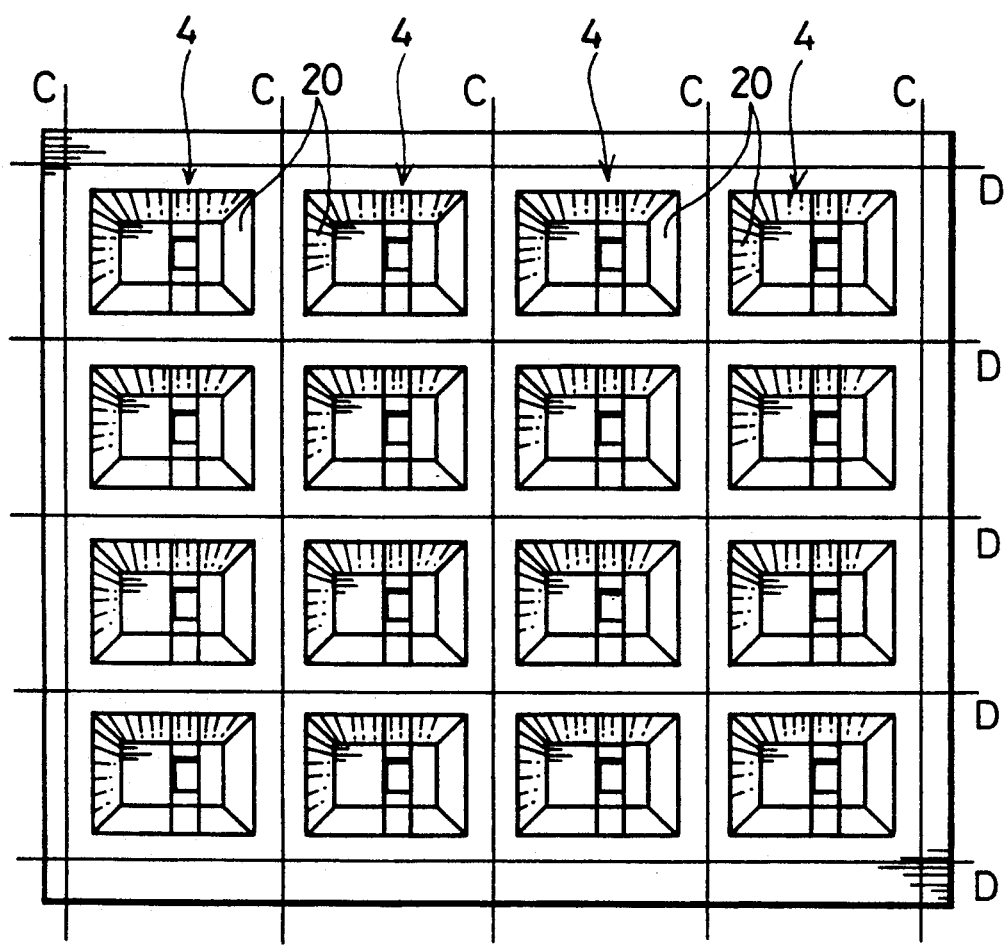
FIG. 11 is a plan view showing cutting lines on the substrate.

After the casting, the substrate is cut along the lines C and D shown in FIG. 11 to produce the chip LEDs of FIG. 6.

Embodiment 2

With reference to FIGS. 12 through 16, a second embodiment of the present invention is described below.

As shown in FIGS. 12 through 16, a chip LED of this embodiment has an insulating block body 31 made of a resin substrate for three dimensional wiring. The insulating block body 31 is produced from a highly heat-resistant resin including a liquid crystal polymer by injection molding. The chip LED is mass-produced through the following processes. Firstly, the insulating block bodies 31 are arranged in a matrix, and are wired in a three dimensional manner. Then, die bonding and wire bonding are performed. The resin sections are molded. Finally, each of the chip LEDs are separated by a dicing saw.

Formed on the surface of each block body 31 is a cavity having sloping sides. The cavity is plated with silver or gold to form a metallic layer 32. A through-hole 40 extending vertically through the block body 31 is symmetrically formed on each side of the bottom of the metallic layer 32. The shape of the through-hole 40 is substantially square when it is seen from above.

Formed at the bottom part of the side surfaces of the block body 31 are electrodes 33 for soldering. An electrode separator 34 is formed by performing masking before plating, or by performing etching after plating. The electrode separator 34 separates anode from cathode. An LED chip 35 is die-bonded onto one side of the metallic layer 32 thus separated and is connected to the other side of the metallic surface with a metallic wire 36. Then, the cavity is filled up with an epoxy resin 37.

Figure 12:
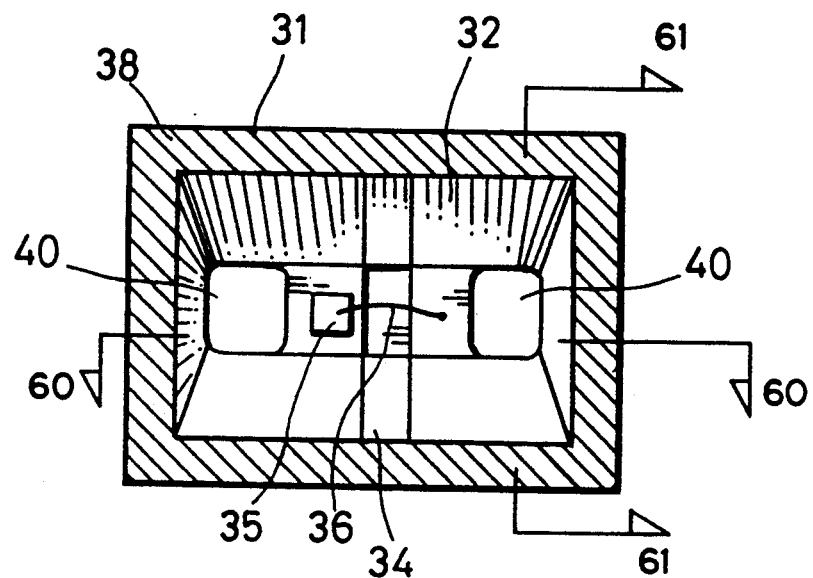
FIG. 12 is a plan view of a chip LED according to the alternative embodiment of the present invention.
Figure 13:
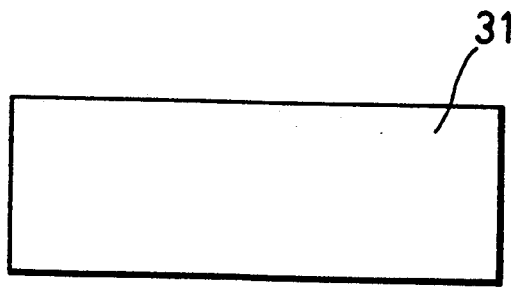
FIG. 13 is a front view of the chip LED of FIG. 12.
Figure 14:
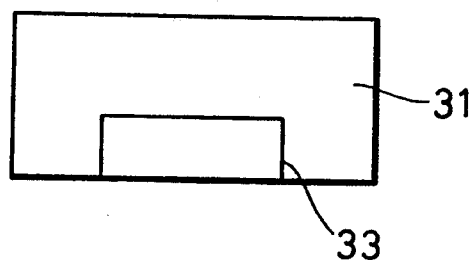
FIG. 14 is a side view of the chip LED.
Figure 15:
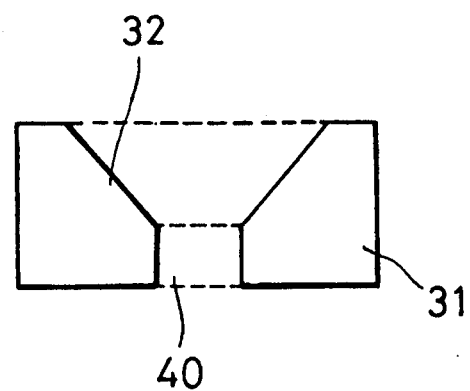
FIG. 15 is a profile of the chip LED cut across the line G—G.
Figure 16:
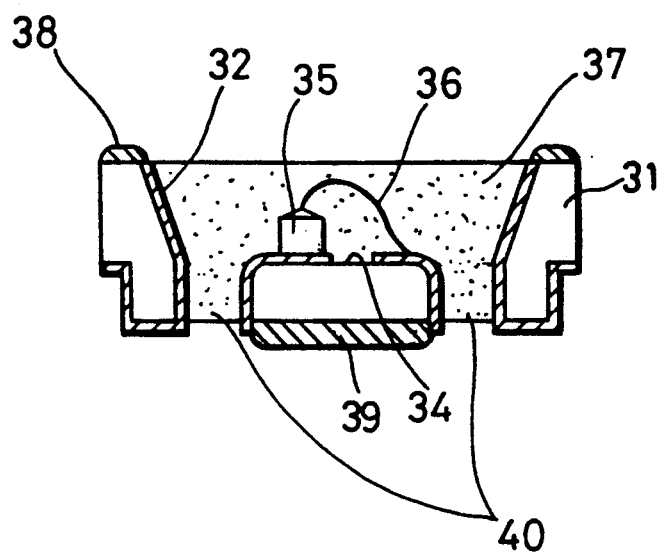
FIG. 16 is a profile of the chip LED cut across the line H—H.

In FIGS. 12 and 16, sections 38 and 39 shown in check patterns are resist sections on which a resist ink is applied. More specifically, the first resist section 38 located at the peripheral of the block body 31 indicates the polarity of the electrode and prevents the overflow of the epoxy resin 37. When the chip LED is surface-mounted by soldering in a reflow furnace, the second resist section 39 located at the center on the bottom, (back) surface of the block body 31 prevents short circuit of the chip during soldering by insulating the anode and the cathode from each other.

The chip LED with the above-mentioned structure efficiently emits a beam of light from the LED chip 35 through a reflecting case (not shown) surrounding the LED chip 35. It is therefore possible to produce highly-bright LED lamps by using chip LEDs.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A light emitting element comprising:
   an insulating substrate having a cavity at the center of a top surface thereof and a through-hole formed in the bottom of said cavity, sides of said cavity slope outward toward the top surface, said through-hole extending downward through said insulating substrate to a bottom surface;
   a first electrode which is formed to continuously cover a first side of said cavity, a first portion of said through-hole, a first portion of said bottom surface and a first side surface of said substrate, wherein the first electrode does not cover the entire portion of said first side surface;
   a second electrode which is formed to continuously cover a second side of said cavity, a second portion of said through-hole, a second portion of the bottom surface and a second side surface of said substrate, said second side of said cavity facing said first side of said cavity, said second side surface of said substrate facing said first surface of said substrate, wherein the second electrode does not cover the entire portion of said second side surface;
   light emitting means, electrically joined to said first electrode, for emitting light when electricity is conducted;
   connecting means for electrically connecting said light emitting means to said second electrode; and
   translucent sealing means for filling said cavity and said through hole.

2. The light emitting element according to claim 1, wherein said through-hole has sides which slope outward toward the bottom surface of the insulating substrate.

3. The light emitting element according to claim 1, wherein said insulating substrate is formed of a heat-resistant resin.

4. The light emitting element according to claim 1, wherein said first and second electrodes are formed by plating.

5. The light emitting element according to claim 1, wherein said light emitting means is a light emitting diode chip mounted to the bottom of said cavity with a conductive paste.

6. The light emitting element according to claim 1, wherein said connecting means is a metallic wire.

7. The light emitting element according to claim 1, wherein said sealing means is an epoxy resin.

8. The light emitting element according to claim 1, wherein a pair of through-holes are formed, one of said through-holes being respectively formed on the first and second sides of said cavity.

9. The light emitting element according to claim 8, wherein said insulating substrate has resist sections, said resist sections being formed by depositing a resist ink onto the top edge of said substrate and the bottom surface of said insulating substrate between said through holes.

10. The light emitting element according to claim 1, wherein the sides of said cavity slope outward toward the top surface of the insulating substrate at an angle of less than 90° with respect to the bottom of the cavity for reflecting light emitted from said light emitting element toward the top surface of said insulating substrate through said translucent sealing means.

11. The light emitting element according to claim 10, wherein the sides of the through-hole slope in a direction outward toward the bottom of the insulating substrate at an angle of less than 90° for stabilizing the internal forces within the translucent sealing means which fills the cavity and the through-hole.

12. The light emitting element according to claim 1, wherein the first side surface includes a first recessed portion extending along a portion of said first side surface for receiving the first electrode so that the first electrode does not extend along the entire length of the first side surface; and the second side surface includes a recessed portion extending along a portion of said second side surface for receiving the second electrode so that the second electrode does not extend along the entire length of the second side surface.

13. The light emitting element according to claim 8, wherein said through-hole has sides which slope outward toward the bottom surface of the insulating substrate.

14. The light emitting element according to claim 8, wherein said substrate is formed of a heat-resistant resin.

15. The light emitting element according to claim 8, wherein said first and second electrodes are formed by plating.

16. The light emitting element according to claim 8, wherein said light emitting means is a light emitting diode chip mounted to the bottom of said cavity with a conductive paste.

17. The light emitting element according to claim 8, wherein said connecting means is a metallic wire.

18. The light emitting element according to claim 8, wherein said sealing means is an epoxy resin.

19. The light emitting element according to claim 8, wherein the sides of said cavity slope outward toward the top surface of the insulating substrate at an angle of less than 90° with respect to the bottom of the cavity for reflecting light emitted from said light emitting element toward the top surface of said insulating substrate through said translucent sealing means.

20. The light emitting element according to claim 11, wherein the sides of the through-hole slope in a direction outward toward the bottom of the insulating substrate at an angle of less than 90° for stabilizing the internal forces within the translucent sealing means which fills the cavity and the through-hole.

21. The light emitting element according to claim 20, wherein the first side surface includes a first recessed portion extending along a portion of said first side surface for receiving the first electrode so that the first electrode does not extend along the entire length of the first side surface; and the second side surface includes a recessed portion extending along a portion of said second side surface for receiving the second electrode so that the second electrode does not extend along the entire length of the second side surface.

22. The light emitting element according to claim 8, wherein said first electrode reaches from said first side of said cavity to said first side surface of said substrate through one of said through-holes, and said second electrode reaches from said second side of said cavity to said second side surface of said substrate through the other through-hole.

23. The light emitting element according to claim 8, wherein said first electrode is further formed to continuously cover a first part of said bottom of said cavity, said second electrode is further formed to continuously cover a second part of said bottom of said cavity, said first part and said second part are electrically insulated with each other and located between one of said through-holes and the other through-hole, said light emitting means is electrically joined to said first electrode at said first part, and said connecting means electrically connects said light emitting means to said second electrode at said second part.

* * * * *